United States Patent
Go

(10) Patent No.: US 6,603,533 B2
(45) Date of Patent: *Aug. 5, 2003

(54) IRRADIATION CONTROL METHOD AND APPARATUS FOR PULSED LIGHT SOURCE USED IN EXPOSURE APPARATUS

(75) Inventor: Masato Go, Yokohama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/579,740

(22) Filed: May 26, 2000

(65) Prior Publication Data

US 2002/0071108 A1 Jun. 13, 2002

Related U.S. Application Data

(63) Continuation of application No. PCT/JP98/05325, filed on Nov. 26, 1998.

(30) Foreign Application Priority Data

Nov. 28, 1997 (JP) .............................. 9-329256

(51) Int. Cl.$^7$ ........................ G03B 27/72; G03B 27/42
(52) U.S. Cl. ............................. 355/71; 355/69; 355/53
(58) Field of Search .............................. 355/53, 67–71, 355/77; 356/399–401; 250/492.2, 492.22, 492.23

(56) References Cited

U.S. PATENT DOCUMENTS

| | | | |
|---|---|---|---|
| 4,924,257 A | | 5/1990 | Jain ............................. 355/53 |
| 5,097,291 A | * | 3/1992 | Suzuki ......................... 355/69 |
| 6,154,270 A | * | 11/2000 | Ozawa ......................... 355/53 |
| 6,204,911 B1 | * | 3/2001 | Kurosawa et al. ............. 355/53 |
| 6,268,906 B1 | * | 7/2001 | Suzuki ......................... 355/67 |

FOREIGN PATENT DOCUMENTS

JP  8-339954  12/1996  ......... H01L/21/027

* cited by examiner

Primary Examiner—Henry Hung Nguyen
(74) Attorney, Agent, or Firm—Synnestvedt & Lechner LLP

(57) ABSTRACT

A pulsed light source irradiation control method that irradiates a pulsed beam on an illumination subject includes the steps of measuring the energy of a pulsed beam having a predetermined oscillation frequency emitted from the pulsed light source, determining the actual oscillation frequency of the emitted pulsed beam in accordance with the number of pulses of the pulsed beam, and adjusting the energy of the pulsed beam when the actual oscillation frequency differs from the predetermined oscillation frequency.

43 Claims, 7 Drawing Sheets

LB Moving Direction

IRRADIATION CONTROL METHOD AND APPARATUS FOR PULSED LIGHT SOURCE USED IN EXPOSURE APPARATUS

RELATED APPLICATIONS

This application is a continuation of PCT application number PCT/JP98/05325 filed on Nov. 26, 1998.

BACKGROUND OF THE INVENTION

The present invention relates to an irradiation control method and irradiation control apparatus for a pulsed light source for irradiating a pulsed beam on an illumination subject. More specifically, the present invention relates to an irradiation control method and irradiation control apparatus for a pulsed light source for an exposure apparatus which is used in photolithography process for fabricating a micro device, such as a semiconductor device, a liquid crystal display device, an image pickup device (CCD or the like) or a thin-film magnetic head.

Conventionally, fabrication of devices, such as semiconductor devices, uses an exposure apparatus which transfers and exposes the pattern of a reticle as a mask on a wafer (or a glass plate) on which a photosensitive material, such as a photoresist, is coated. The recent miniaturization of circuit patterns demands that such an exposure apparatus have a higher resolution. A high resolution may be acquired by shortening the wavelength of exposure light or increasing the numerical aperture (N.A.) of a projection optical system. Increasing the numerical aperture of the projection optical system however makes the depth of focus shallower. Therefore, a practical solution is to employ, for example, an excimer laser which has a short wavelength.

When an excimer laser is used as a pulsed light source, the integrated amount of exposure may vary from one point to another in each shot area on a wafer. At the time of exchanging a wafer or at the time of measuring alignment of a reticle, wafer or the like, for example, the emission interval of laser beams becomes long. In such a case, laser learning control is halted such that the state of the gas in the laser chamber, for example, differs from that at the time of the last laser emission before the halt. As a result, the laser beam output varies. The energy of the pulsed beam emitted from the pulsed light source may go significantly above or below the set energy until the pulsed light source returns to a stable oscillation state since the initiation of emission of the laser beam.

Recently, modified illumination for irradiating exposure light from an illumination optical system onto a reticle via an annular aperture or a diaphragm with a small aperture has been adopted in order to cope with the requirement for higher resolution. When the normal illumination is switched to the modified illumination, however, the intensity of the energy of exposure light that reaches the top of a wafer changes. To cope with such a change in the energy of the laser beam, conventional exposure apparatus is equipped with an exposure dose control capability which sets the aforementioned integrated amount of exposure (integrated exposure energy) within a proper range.

Exposure apparatus includes a full wafer exposure apparatus and scanning exposure apparatus. The full wafer exposure apparatus projects and exposes the pattern of a reticle on the shot areas on a wafer when a wafer stage on which the wafer is placed is still. When a pulsed light source is used, the full wafer exposure apparatus basically employs an exposure dose control method based on cutoff control.

According to this cutoff control, part of the exposure light directed toward a wafer branches and is led to a photodetector called an integrator sensor. The integrator sensor indirectly detects the amount of exposure on the wafer. The integrated value of this detection result is checked to determine if is exceeds a predetermined level (critical level) corresponding to the set exposure amount. When the integrated value exceeds the critical level, the laser emission from the light source is stopped.

The scanning exposure apparatus scans a reticle and a wafer with a step and scan system or the like in synchronism with the projection optical system to thereby sequentially transfer the pattern of the reticle onto the individual shot areas on the wafer. For example, Japanese Unexamined Patent Publication No. 8-8160 and its corresponding U.S. Pat. No. 5,677,754 disclose a scanning exposure apparatus which integrates the energy of a laser beam prior to exposure of individual shot areas and controls the amount of exposure based on the integrated value.

Specifically, the integrated value is measured based on the amount of exposure detected by the integrator sensor, and the average energy E of one pulse of a laser beam is computed based on the integrated value. To acquire the linearity of the desired exposure dose control, the average energy E of the laser beam is adjusted such that the number of exposure pulses of the laser beam becomes an integer using the following equation (1):

$$So = N \times E \quad (1)$$

where So is the set amount of exposure and N is the number of exposure pulses per point.

In the case of a scanning exposure apparatus, the following equation (2) in addition to the equation (1) should be satisfied.

$$V = Ws/N \times f \quad (2)$$

where V is the scanning speed on a wafer or a wafer stage, Ws is the width (slit width) of a slit-like exposure area on the wafer surface in the scanning direction and f is the oscillation frequency of the pulsed light source.

In the exposure sequence of the conventional exposure apparatus, first, the set exposure amount So is set and the pulsed light source emits a laser beam having the maximum oscillation frequency fmax and a predetermined oscillation output. Then, the integrator sensor measures the average energy E of the laser beam and computes the number N of exposure pulses per point in each shot area on the wafer. Exposure parameters, such as the transmittance of a light reducing unit, the oscillation output of the pulsed light source, the exposure pulse number N and the oscillation frequency f of the pulsed light source, at the time of scanning exposure are determined based on the computed pulse number N, the maximum oscillation frequency fmax and the predetermined slit width Ws. In addition to those exposure parameters, the scanning speed V is also determined based on the equation (2).

Note that the conventional exposure apparatus measures the energy of a laser beam which has the maximum oscillation frequency fmax only once before exposing a wafer. The pulsed light source is designed to ensure the most stable energy state at the rated maximum oscillation frequency fmax. When the oscillation frequency f in the exposure parameters differs from the maximum oscillation frequency fmax, therefore, the actual energy of the laser beam that has been emitted at the oscillation frequency f differs from the energy measured first at the maximum oscillation frequency fmax. This makes it difficult to carry out accurate exposure on a wafer.

When an ArF excimer laser which has a short wavelength is used, particularly, the transmittances of the illumination optical system and projection optical system change with time due to moisture present in the exposure apparatus, an organic material such as a silicon-based material, or the like. In this case, the difference between the actual energy and the energy measured first becomes larger.

SUMMARY OF THE INVENTION

It is an object of the present invention to provide an irradiation control method and apparatus for a pulsed light source which can reduce a difference between the measured energy of a pulsed beam and the actual energy.

In a first aspect of the present invention, there is provided an irradiation control method for a pulsed light source for irradiating a pulsed beam on an illumination subject. In this method, the energy of a pulsed beam having a predetermined oscillation frequency emitted from the pulsed light source is measured first. Next, the oscillation frequency of the pulsed light source is determined in accordance with the number of pulses of the pulsed beam which is determined based on a relationship between the measured energy and a predetermined illumination energy. Then, the energy of the pulsed beam is adjusted when the determined oscillation frequency differs from the predetermined oscillation frequency.

In a second aspect of the present invention, there is provided an irradiation control apparatus for controlling a pulsed light source for irradiating a pulsed beam on an illumination subject. The apparatus includes a measuring device which measures energy of a pulsed beam having a predetermined oscillation frequency emitted from the pulsed light source. The apparatus further includes a determining device which determines an oscillation frequency of the pulsed light source in accordance with the number of pulses of the pulsed beam which is determined based on a relationship between the measured energy and a predetermined illumination energy, and an adjusting device which adjusts the energy of the pulsed beam when the determined oscillation frequency differs from the predetermined oscillation frequency.

In a third aspect of the present invention, there is provided an exposure apparatus for irradiating a pulsed beam from a pulsed light source on a photosensitive substrate via a mask to thereby expose a pattern of the mask on the photosensitive substrate. The exposure apparatus includes an apparatus for controlling the pulsed light source for irradiating the pulsed beam on an illumination subject. The control apparatus includes a measuring device which measures energy of a pulsed beam having a predetermined oscillation frequency emitted from the pulsed light source. The control apparatus further includes a determining device which determines an oscillation frequency of the pulsed light source in accordance with the number of pulses of the pulsed beam which is determined based on a relationship between the measured energy and a predetermined illumination energy, and an adjusting device which adjusts the energy of the pulsed beam when the determined oscillation frequency differs from the predetermined oscillation frequency.

In a fourth aspect of the present invention, there is provided an exposure method for irradiating a pulsed beam emitted from a light source on a photosensitive substrate via a mask to thereby expose a pattern of the mask on the photosensitive substrate. In the exposure method, the energy of a pulsed beam having a predetermined oscillation frequency emitted from the light source is measured first. Next, the oscillation frequency of the pulsed beam at the time of exposing the photosensitive substrate is determined based on the measured energy. Then, the energy of the pulsed beam oscillated from the light source is adjusted when the predetermined oscillation frequency at the time of measuring the energy differs from the determined oscillation frequency at the time of exposure.

In a fifth aspect of the present invention, there is provided a method of manufacturing an irradiation control apparatus for controlling a pulsed light source for irradiating a pulsed beam on an illumination subject. This method provides a measuring device which measures energy of a pulsed beam having a predetermined oscillation frequency emitted from the pulsed light source. The method also provides a determining device which determines an oscillation frequency of the pulsed light source in accordance with the number of pulses of the pulsed beam which is determined based on a relationship between the measured energy and a predetermined illumination energy. The method further provides an adjusting device which adjusts the energy of the pulsed beam when the determined oscillation frequency differs from the predetermined oscillation frequency.

In a sixth aspect of the present invention, there is provided a method of manufacturing an exposure apparatus for irradiating a pulsed beam from a pulsed light source on a photosensitive substrate via a mask to thereby expose a pattern of the mask on the photosensitive substrate. The method provides an apparatus for controlling the pulsed light source for irradiating the pulsed beam on an illumination subject. The control apparatus includes a measuring device which measures energy of a pulsed beam having a predetermined oscillation frequency emitted from the pulsed light source. The control apparatus further includes a determining device which determines an actual oscillation frequency of the pulsed light source in accordance with the number of pulses of the pulsed beam which is determined based on a relationship between the measured energy and a predetermined illumination energy, and an adjusting device which adjusts the energy of the pulsed beam when the determined oscillation frequency differs from the predetermined oscillation frequency. The manufacturing method further provides a scanning exposure mechanism for moving the mask and the photosensitive substrate in synchronism with each other.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1:
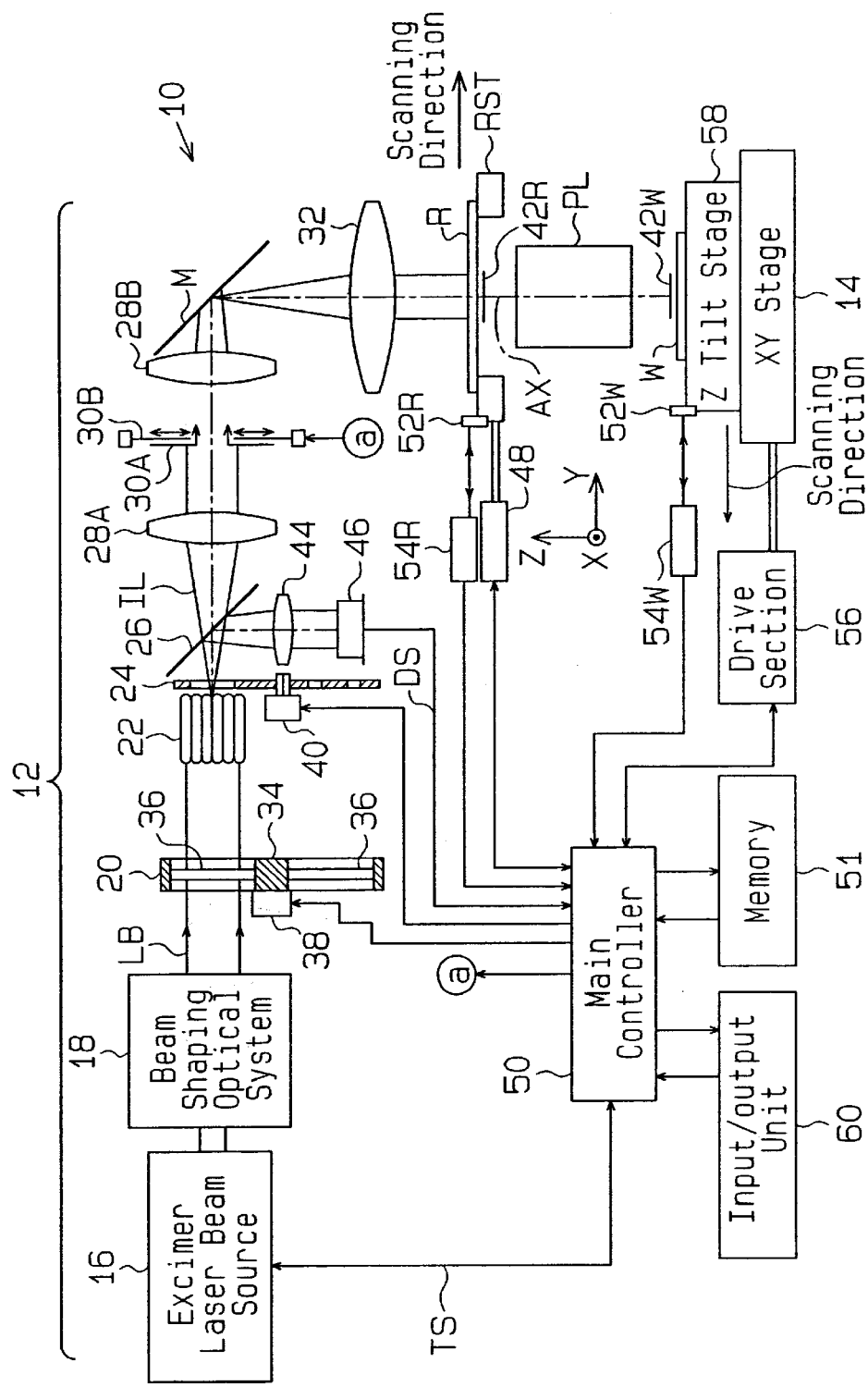
FIG. 1 is a schematic diagram illustrating the structure of a scanning exposure apparatus according to first and second embodiments.

A first embodiment of the present invention will now be described with reference to FIGS. 1 through 4. FIG. 1 illustrates the schematic structure of a scanning exposure apparatus 10 of a step and scan type according to the first embodiment. This scanning exposure apparatus 10 uses an excimer laser as a pulsed light source for exposure.

The scanning exposure apparatus 10 has an illumination optical system 12, a reticle stage (mask stage) RST that moves in a predetermined scanning direction while holding a reticle (mask) R which is illuminated by the illumination optical system 12, a projection optical system PL which projects the pattern of the reticle R on a wafer W, an XY stage 14 which moves on a horizontal plane (within the XY plane) while holding the wafer W, and a main controller 50.

The illumination optical system 12 has an excimer laser light source 16, a beam shaping optical system 18, a rough energy adjuster 20, a fly eye lens 22, an illumination-optical-system aperture stop plate 24, a beam splitter 26, a first relay lens 28A, a second relay lens 28B, a fixed reticle blind 30A, a movable reticle blind 30B, a mirror M for deflecting the optical path and a condenser lens 32.

Available as the excimer laser light source 16 is a KrF excimer laser light source (oscillation wavelength of 248 nm), ArF excimer laser light source (oscillation wavelength of 193 nm), $F_2$ excimer laser light source (oscillation wavelength of 157 nm) or the like.

The beam shaping optical system 18 shapes the cross-sectional shape of a laser beam LB from the excimer laser light source 16 so that the laser beam LB efficiently enters the fly eye lens 22. The beam shaping optical system 18 preferably comprises a cylinder lens, a beam expander (neither shown) or the like.

The rough energy adjuster 20 is located in the optical path of the laser beam LB beyond the beam shaping optical system 18. The rough energy adjuster 20 has a rotary plate 34 and a plurality of (e.g., 6) ND filters 36 (two ND filters are shown in FIG. 1) which are arranged around the rotary plate 34 and have transmittances (=1−light reducing ratio) different from one another. As the rotary plate 34 is rotated by a drive motor 38, the transmittance with respect to the laser beam LB is changed in a geometrical series in plural steps from 100% to any %. The drive motor 38 is controlled by the main controller 50.

The fly eye lens 22 is located in the optical path of the laser beam LB beyond the rough energy adjuster 20 and forms multiple secondary light sources for illuminating the reticle R with a uniform illuminance distribution. The laser beam emitted from this secondary light source is hereinafter called "pulse illuminating light IL".

The illumination optical system aperture stop plate 24 is located near the light emerging surface of the fly eye lens 22.

It is preferable that the aperture stop plate 24 is formed like a disc and have a plurality of aperture stops arranged at equiangular distances. At least one of the shape and size of each aperture stop differs from that of another one. For example, a normal circular aperture stop, a small aperture stop for reducing the coherence factor σ, an annular aperture stop for annular illumination, a modified aperture stop having a plurality of apertures arranged eccentrically for modified illumination, and so forth are provided. The aperture stop plate 24 is rotated by a drive unit 40, such as a motor, which is controlled by the main controller 50. The individual aperture stops are selectively arranged in the optical path of the pulse illuminating light IL in accordance with the pattern of the reticle R, such as a cyclic pattern or an isolation pattern, so that at least one of the shape and size of the intensity distribution of the light sources, or pulse illuminating light IL, is altered. In this embodiment, the focus plane of the fly eye lens 22 on the light emerging side where the secondary light sources are formed is arranged on a plane which has a Fourier transform relation with the pattern surface of the reticle R in the illumination optical system 12 (this plane will hereinafter be called a Fourier transform plane and is a synonym of "pupil plane" of the illumination optical system in this specification). A selected one of the aperture stops provided in the aperture stop plate 24 is located substantially on that Fourier transform plane. Because the fly eye lens 22 is used as an optical integrator (homogenizer) in this embodiment, the secondary light sources are a surface light source comprised of multiple optical images which are formed by the fly eye lens on its focus plane on the light emerging side.

Disposed in the optical path of the pulse illuminating light IL beyond the aperture stop plate 24 is the beam splitter 26 which has a relatively small reflectance and relatively large transmittance. A relay optical system which comprises the first relay lens 28A and second relay lens 28B, is located further back on the optical path with the fixed reticle blind 30A and movable reticle blind 30B disposed between the first relay lens 28A and the second relay lens 28B.

The fixed reticle blind (fixed field stop) 30A is disposed on a plane which is slightly defocused from a conjugate plane with respect to the pattern surface of the reticle R and has a rectangular opening which defines an illumination area 42R on the reticle R. Disposed in the vicinity of the fixed reticle blind 30A is the movable reticle blind 30B which has an opening whose position and width in the scanning direction are variable. As the illumination area 42R is restricted via the movable reticle blind (variable field stop) 30B when scanning exposure starts and ends, exposure of an unnecessary portion on the wafer W is prevented.

Disposed in the optical path of the pulse illuminating light IL beyond the second relay lens 28B is the deflection mirror M that reflects the pulse illuminating light IL, which has passed the second relay lens 28B, toward the reticle R. The condenser lens 32 is located in the optical path of the pulse illuminating light IL beyond this mirror M.

The operation of the illumination optical system 12 constructed in the above-described manner will now be discussed briefly. The laser beam LB emitted in a pulsed form from the excimer laser light source 16 enters the beam shaping optical system 18 where its cross-sectional shape is shaped. The resultant laser beam LB efficiently enters the rough energy adjuster 20. The laser beam LB that passes any one of the ND filters 36 of the rough energy adjuster 20 enters the fly eye lens 22. As a result, secondary light sources formed of multiple optical images are formed on the light emerging end of the fly eye lens 22. The pulse illuminating light IL emitted from the secondary light sources passes one of the aperture stops on the aperture stop plate 24 located in the optical path of the illumination optical system 12, then reaches the beam splitter 26. The pulse illuminating light IL that passes the beam splitter 26 passes the rectangular opening of the fixed reticle blind 30A and the movable reticle blind 30B via the first relay lens 28A. Thereafter, the pulse illuminating light IL passes the second relay lens 28B and is deflected vertically downward by the mirror M, passes the condenser lens 32, and then illuminates the rectangular illumination area 42R on the reticle R with a uniform illuminance distribution.

Meanwhile, the pulse illuminating light IL that is reflected by the beam splitter 26 is received by an integrator sensor (photoelectric converting device) 46 via a condenser lens 44. A photoelectrically converted signal from the integrator sensor 46 is supplied to the main controller 50 via a peak hold circuit and an A/D converter (neither shown) as an output DS (unit: digit/pulse). Available as the integrator sensor 46 is, for example, a PIN type photodiode which has a sensitivity to the wavelength range of deep ultraviolet rays and a high response frequency suitable for detection of pulse emission from the excimer laser light source 16. A coefficient which represents the correlation between the output DS of the integrator sensor 46 and the illuminance (the amount of light) of the pulse illuminating light IL on the surface of the wafer W is set in advance and stored in a memory 51 connected to the main controller 50. The coefficient is acquired by driving the XY stage 14 to place an unillustrated irradiation dose monitor (photoelectric converting device), provided on a Z tilt stage 58, within an irradiation area (an exposure area 42W described later) for the pulse illuminating light IL and causing the irradiation dose monitor and the integrator sensor 46 to detect the intensities of a plurality of pulse illuminating lights IL.

The reticle R placed on the reticle stage RST is held and adsorbed by a vacuum chuck (not shown). The reticle stage RST is movable by a slight distance within a horizontal plane (XY plane) and is scanned by a reticle-stage drive section 48 in the scanning direction (the right and left direction on the sheet surface of FIG. 1 or the Y direction) by a predetermined stroke. The scan position of the reticle stage RST is measured by an external laser interferometer 54R using a movable mirror 52R fixed on the reticle stage RST. The value measured by the laser interferometer 54R is supplied to the main controller 50.

The projection optical system PL is a double-side telecentric optical system and comprises a plurality of lens elements having a common optical axis AX in the Z axial direction. The projection magnification α of the projection optical system PL is set, for example, to ¼ or ⅕. When the illumination area 42R on the reticle R is illuminated by the pulse illuminating light IL, therefore, a part of the pattern formed on the reticle R within the illumination area 42R is reduced by the projection magnification α by the projection optical system PL. The reduced pattern image is projected on the slit-shaped exposure area 42W on the resist surface on the wafer W. The exposure area 42W is a projection area where the reduced image of a part of the pattern formed on the reticle R is formed. The projection optical system PL has a circular field of view (circular image field). The illumination area 42R and the exposure area 42W are elongated rectangular areas which have optical axes near the center within the field of view of the projection optical system PL and extend in a non-scanning direction (X direction) perpendicular to the scanning direction (Y direction) of the reticle R and wafer W.

The XY stage 14 is driven two-dimensionally in the Y direction and the X direction (the direction perpendicular to the surface of the sheet in FIG. 1) perpendicular to the Y direction by a wafer-stage drive section 56. The Z tilt stage 58 is mounted on the XY stage 14. The wafer W is held on the Z tilt stage 58 preferably by vacuum chuck via a wafer holder (not shown). The Z tilt stage 58 adjusts the position of the wafer W in the Z direction (focus position) and adjusts the tilt angle of the wafer W with respect to the XY plane. The position of the XY stage 14 is measured by an external laser interferometer 54W using a movable mirror 52W fixed on the Z tilt stage 58. The value measured by the laser interferometer 54W is supplied to the main controller 50.

The main controller 50 includes a microcomputer (or a minicomputer) which has a CPU (Central Processing Unit), ROM (Read Only Memory), RAM (Random Access Memory) and so forth. The main controller 50 performs general control of the synchronous scanning of, for example, the reticle R and the wafer W, the stepping of the wafer W and the exposure timing in order to adequately execute the exposure operation.

Specifically, at the time of scanning exposure, for example, the main controller 50 controls the positions and speeds of the reticle stage RST and the XY stage 14 via the reticle-stage drive section 48 and the wafer-stage drive section 56 based on the measured values from the laser interferometers 54R and 54W. That is, when the reticle R is scanned at a speed Vr in the +Y direction (or −Y direction) via the reticle stage RST, the wafer W is scanned in the −Y direction (or +Y direction) with respect to the exposure area 42W at a speed α·Vr (α: projection magnification to the wafer W from the reticle R) in synchronism with the scanning of the reticle R via the XY stage 14. The wafer W is therefore moved in synchronism with the movement of the reticle R.

At the time of stepping, the main controller 50 controls the position of the XY stage 14 via the wafer-stage drive section 56 based on the measured value from the laser interferometer 54W. According to the first embodiment, the main controller 50, the laser interferometers 54R and 54W, the reticle-stage drive section 48 and the wafer-stage drive section 56 constitute the stage control system.

The main controller 50 controls the emission timing and emission power of the excimer laser light source 16 by supplying control information TS to the excimer laser light source 16. The main controller 50, the excimer laser light source 16 and the stage control system constitute the scanning exposure mechanism. The main controller 50 controls the rough energy adjuster 20 and the aperture stop plate 24 respectively via the motor 38 and the drive unit 40 and further controls the opening/closing operation of the movable reticle blind 30B in synchronism with the operational information of the stage systems. According to this embodiment, as described above, the main controller 50 also serves as an exposure controller and a stage controller.

A description will now be given of the excimer laser light source 16 of the scanning exposure apparatus 10 according to the first embodiment.

Figure 2:
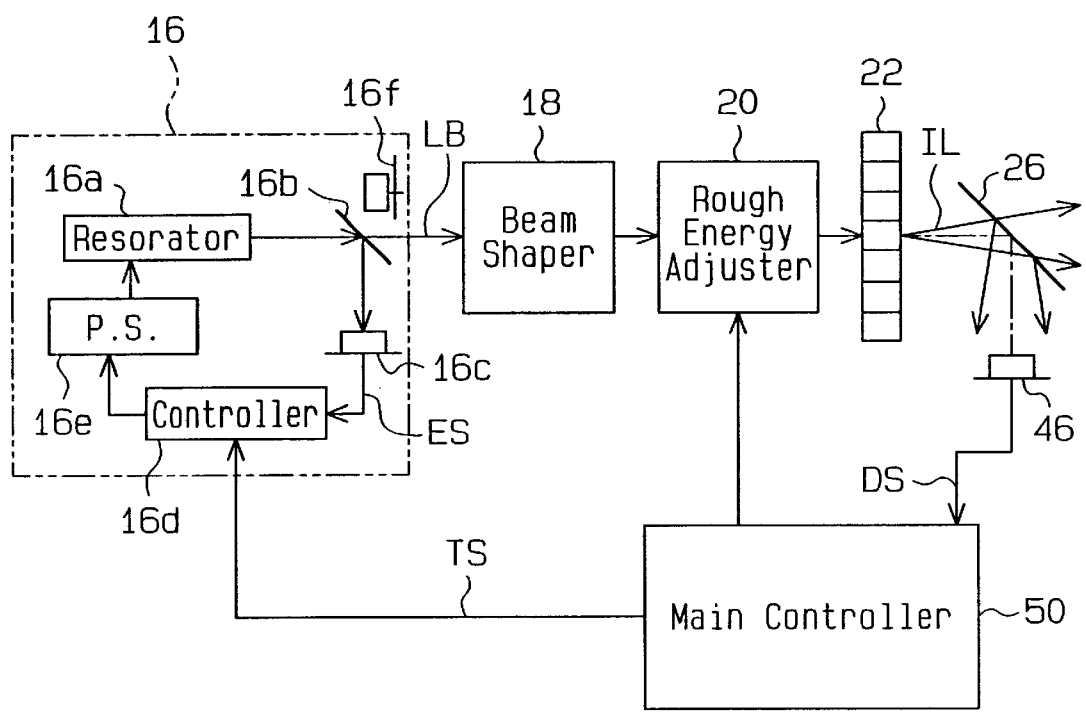
FIG. 2 is a schematic block diagram of an excimer laser light source for the exposure apparatus in FIG. 1.

As shown in FIG. 2, the excimer laser light source 16 has a laser resonator 16a, a beam splitter 16b, an energy monitor 16c, an energy controller 16d and a high-voltage power supply 16e. The beam splitter 16b has a relatively high transmittance and a slight reflectance.

Referring to FIG. 2, the laser pulsed beam emitted from the laser resonator 16a enters the beam splitter 16b and the laser beam LB that passes through the beam splitter 16b is emitted. The laser beam reflected by the beam splitter 16b enters the energy monitor 16c. The photoelectrically converted signal from the energy monitor 16c is supplied via a peak hold circuit (not shown) to the energy controller 16d as an output ES. The unit of the energy control quantity corresponding to the output ES from the energy monitor 16c is "mJ/pulse". The energy controller 16d performs feedback control on the high voltage of the high-voltage power supply 16e such that at the time of normal emission, the value of the output ES of the energy monitor 16c corresponds to the target value of the energy per pulse. The target value of the energy is included in the control information TS supplied from the main controller 50. The energy controller 16d further controls the energy, supplied to the laser resonator 16a, via the high-voltage power supply 16e to thereby alter the oscillation frequency. That is, the energy controller 16d sets the oscillation frequency of the excimer laser light source 16 to the frequency specified by the main controller 50 in accordance with the control information TS from the main controller 50. The energy controller 16d also performs feedback control on the supply voltage of the high-voltage power supply 16e such that the energy per pulse in the excimer laser light source 16 is substantially the same as the energy specified by the main controller 50.

Located outside the beam splitter 16b in the excimer laser light source 16 is a shutter 16f which blocks the laser beam LB in accordance with the control information TS from the main controller 50.

The basic exposure dose control sequence of the scanning exposure apparatus 10 according to this embodiment will now be explained with reference to the flowcharts in FIGS. 3 and 4 that show the control algorithm of the CPU in the main controller 50.

The quantities used hereunder are defined as follows.

(a) So: exposure amount or dose (set exposure dose) which is set by an operator for the photoresist on the wafer W.

(b) N: the number of pulses (exposure pulse number) of the pulse illuminating light IL irradiated per point on the wafer.

(c) H: average pulse energy density (mJ/(cm$^2$·pulse)) on an image surface (wafer) which is indirectly measured by the integrator sensor 46.

(d) Vmax: maximum scanning speed (mm/s) of the XY stage 14.

(e) Nmin: minimum number of exposure pulses irradiated per point on the wafer.

(f) Ws: effective slit width (mm) of the exposure area 42W associated with the scanning direction on the wafer.

(g) fmax: actual maximum oscillation frequency (Hz) of the excimer laser light source 16.

The normal exposure dose control sequence is carried out as follows.

Figure 3:
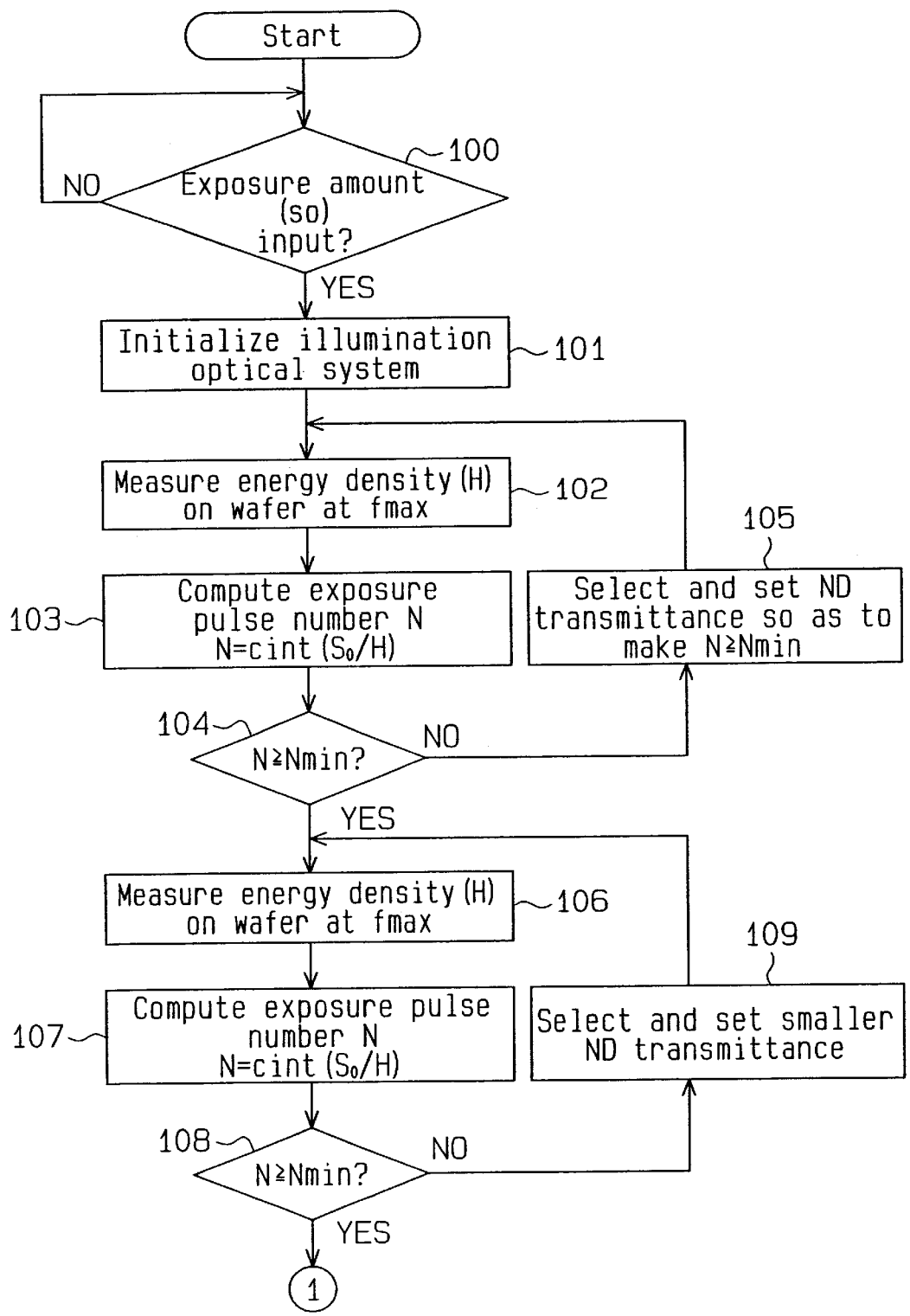
FIG. 3 is a flowchart illustrating an exposure dose control algorithm for a main controller according to the first embodiment.

First, in step 100 in FIG. 3, the scanning exposure apparatus 10 waits for an operator to enter the set exposure amount So via an input/output unit 60 (see FIG. 1) such as a console. The set exposure amount So should preferably be set in accordance with the sensitivity characteristic of the photoresist coated on the surface of the wafer W. When the set exposure amount So is input, the flow proceeds to the next step 101 where the illumination optical system 12 is set to the initial state for measuring the energy of the pulse illuminating light IL. That is, the turntable 34 of the rough energy adjuster 20 is driven such that the ND filter 36 having the maximum transmittance is positioned in the optical path of the laser beam LB. Then, the oscillation frequency of the excimer laser light source 16 is set to the rated maximum oscillation frequency fmax and the oscillation output is set to the rated value.

In the next step 102, the excimer laser light source 16 performs pulse emission at the maximum oscillation frequency fmax plural times (e.g., several hundred times). By integrating the output of the integrator sensor 46 according to that pulse emission, the average pulse energy density H (mJ/(cm$^2$·pulse)) on the wafer W is measured indirectly. This measurement is carried out with, for example, the opening of the fixed reticle blind 30A completely closed by the movable reticle blind 30B so as to inhibit the pulse illuminating light IL from reaching the reticle R. Instead of closing the opening by means of the movable reticle blind 30B, the XY stage 14 may be driven to move the wafer W out of the irradiation area (exposure area 42W) of the pulse illuminating light IL.

In the subsequent step 103, the exposure pulse number N is computed from the following equation (3):

$$N = cint(So/H) \quad (3)$$

where the function "cint" represents a value acquired by rounding off the fraction of the first decimal place.

In the next step 104, it is determined if the exposure pulse number N is equal to or greater than the minimum exposure pulse number Nmin. The minimum exposure pulse number Nmin is the minimum number of pulses necessary to implement exposure dose control and is acquired based on, for example, the ratio δH/H of a variance of the pulse energy (the value of 3δ) δH as a previously measured device constant to the average pulse energy density H. That is, the minimum exposure pulse number Nmin is the number of pulses needed to restrain a variation in the integrated exposure amount within a predetermined allowable range. According to this embodiment, therefore, the pulse illuminating light IL is irradiated, N pulses each, on individual points in the scanning exposure range (shot area) on the wafer W. If N≧Nmin in this embodiment, the integrated exposure amounts within the scanning exposure range for the individual points become nearly equal to one another, and the distribution of the integrated light amounts within the scanning exposure range becomes approximately uniform even in the non-scanning direction (X direction). In other words, a variation in the integrated light amount is suppressed within a predetermined allowable range. When the distribution of the integrated light amounts in the non-scanning direction does not become uniform, even if N pulses of illuminating light IL which satisfy N≧Nmin are irradiated on the individual points in the scanning exposure range, it is preferable to determine the minimum exposure pulse number Nmin in consideration of the number of pulses needed to make the distribution of the integrated light amounts in the non-scanning direction uniform as well as the number of pulses needed to suppress a variation in the integrated light amount within a predetermined allowable range.

If the exposure pulse number N is smaller than the minimum exposure pulse number Nmin in this step 104, the flow proceeds to step 105. In step 105, the ND filter 36 whose transmittance is closest to So/(Nmin×H) and satisfies N≧Nmin is selected. That is, the ND filter 36 is selected so that the transmittance becomes smaller. Thereafter, the steps 102 and 103 are repeated.

When the decision in step 104 is yes or when the decision in step 104 has been affirmative at the beginning (when N≧Nmin), the flow goes to step 106. In step 106, with the ND filter 36 changed, the excimer laser light source 16 is permitted again to perform pulse emission at the maximum oscillation frequency fmax plural times (e.g., several hundred times) as done in step 102. Then, an average pulse energy density H1 on the wafer W is measured again. Then, the flow proceeds to steps 107 and 108 to compute the remeasured average pulse energy density H1 and compute an exposure pulse number N1 based on the average pulse energy density H1 as done in steps 103 and 104. Next, it is determined if the exposure pulse number N1 is equal to or greater than the minimum exposure pulse number Nmin.

When the exposure pulse number N1 is smaller than the minimum exposure pulse number Nmin in step 108, the flow proceeds to step 109 to select the ND filter 36 that has a smaller transmittance. The processes in steps 106 to 109 are thereafter repeated until N≧Nmin is satisfied.

Figure 4:
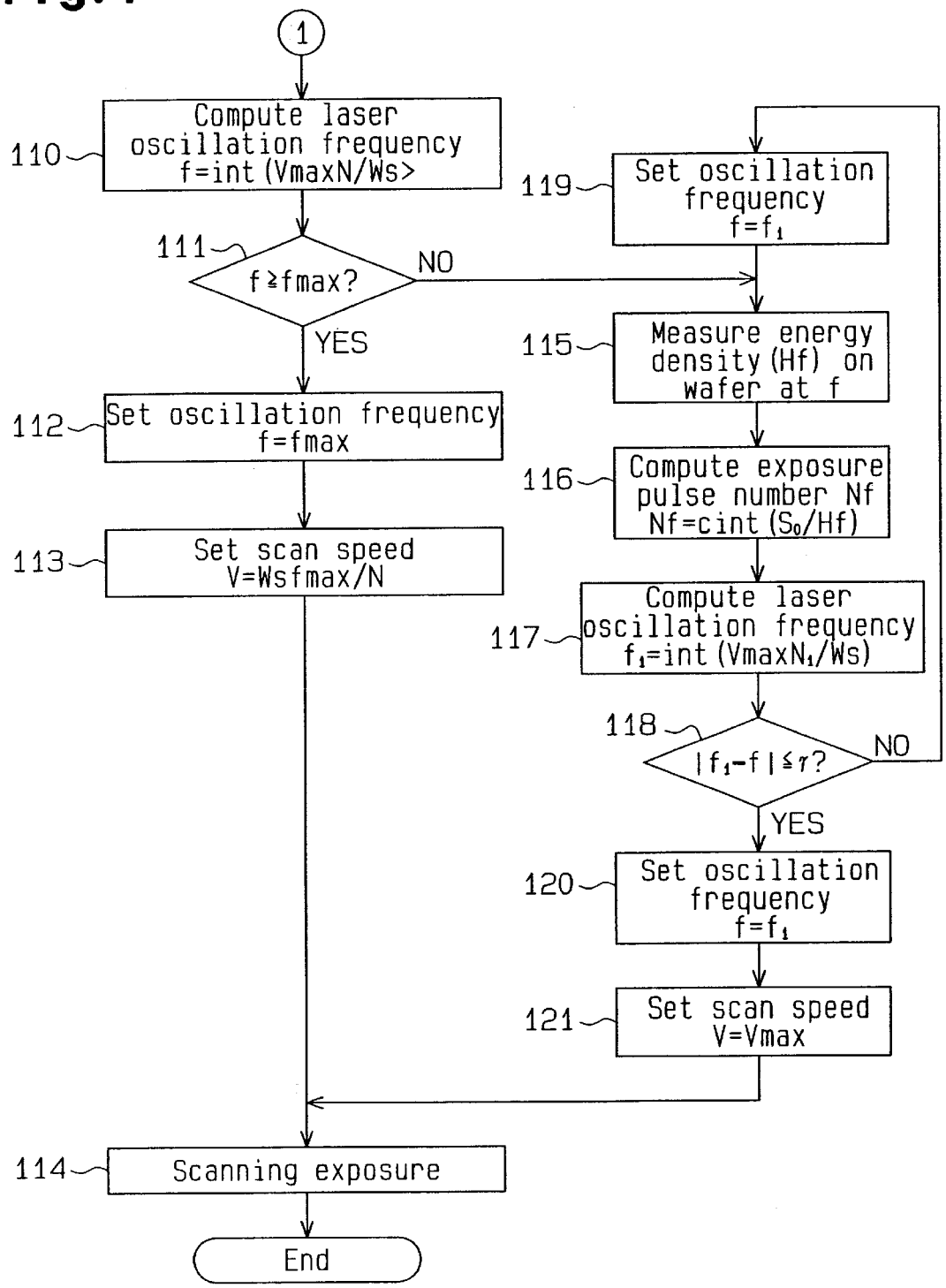
FIG. 4 is a flowchart illustrating an exposure dose control algorithm which is the continuation of the one shown in FIG. 3.

When the decision in step 108 becomes affirmative through the above processing or when the decision in step 108 has been affirmative at the beginning (when N≧Nmin), the flow goes to step 110 shown in FIG. 4. In step 110, a laser oscillation frequency f under the scan speed V=maximum scanning speed (Vmax) is computed from the following equation (4):

$$f = int(V max \times N/Ws) \quad (4)$$

where the function "int(a)" represents a maximum integer which does not exceed a real number a.

In the next step 111, it is determined if the laser oscillation frequency f computed from the equation (4) is equal to or greater than the maximum oscillation frequency fmax of the laser. When this decision is affirmative, the flow goes to step 112. In step 112, it is impossible to set the laser oscillation frequency f computed from the equation (4), so that the laser oscillation frequency f is determined as the maximum oscillation frequency fmax by the energy controller 16d and then the flow proceeds to step 113 to set the scan speed V based on the following equation (5):

$$V = Ws \times fmax/N \quad (5)$$

In step 114, exposure is performed on a plurality of shot areas (defined areas) on the wafer W by the step and scan system in accordance with the set conditions (V, fmax), after which the entire sequence is terminated.

When the decision in step 111 is negative, the flow goes to step 115 to set the laser oscillation frequency f to the value computed from the equation (4). Then, the excimer laser light source 16 is permitted to perform pulse emission at the oscillation frequency f plural times (e.g., several hundred times). Then, an average pulse energy density Hf (mJ/(cm²·pulse)) on the wafer W is indirectly measured again by integrating the output of the integrator sensor 46 corresponding to the pulse emission.

In the next step 116, an exposure pulse number Nf based on the remeasured average pulse energy density Hf is calculated from the following equation (6):

$$Nf = cint(So/Hf) \quad (6)$$

In the subsequent step 117, a laser oscillation frequency f1 based on that exposure pulse number Nf is calculated from the following equation (7):

$$f1 = int(Vmax \times Nf/Ws) \quad (7)$$

In the next step 118, it is determined if the absolute value of the difference between the laser oscillation frequency f used in remeasuring the energy density Hf and the laser oscillation frequency f1 computed from equation (7) is equal to or smaller than a predetermined value γ. That is, it is determined whether or not the computed laser oscillation frequency f1 lies within a predetermined range, $$f - \gamma \leq f1 \leq f + \gamma,$$

set by the laser oscillation frequency f used in remeasurement and the predetermined value γ.

When the decision in step 118 is negative, the flow goes to step 119 to set the laser oscillation frequency f to the value f1 that was computed using equation (7). The flow then proceeds to step 115 to remeasure an energy density Hf1 using the laser oscillation frequency f1. The processes in steps 115 to 119 are repeated until the absolute value of the difference between the laser oscillation frequency f used in remeasuring the energy density Hf and the laser oscillation frequency fn+1 computed from equation (7) becomes equal to or less than the predetermined value γ.

When the decision in step 118 becomes affirmative, the flow goes to step 120 to set the laser oscillation frequency f to the value fn that has been computed from the equation (7). In the next step 121, the scan speed V is set to the maximum scanning speed Vmax after which the flow proceeds to step 114. As exposure is performed under the thus set conditions (Vmax, fn), after which the entire sequence is terminated.

The first embodiment having the above-described structure has the following advantages.

(1) Prior to scanning exposure of the wafer W, the average pulse energy density H of the pulse illuminating light IL is measured by the integrator sensor 46 and the oscillation frequency f of the excimer laser light source 16 is determined based on that energy density H. When the oscillation frequency f is less than the maximum oscillation frequency fmax, the average pulse energy density Hf of the pulse illuminating light IL on the wafer W is remeasured based on the determined oscillation frequency f.

Therefore, the average pulse energy density Hf of the pulse illuminating light IL on the wafer W is always measured at the oscillation frequency f which is set at the time of scanning exposure. Based on the measuring result, the oscillation frequency and scan speed are set and the energy per pulse of the excimer laser light source 16 is adjusted so as not to exceed the set exposure amount. This reduces the difference between the computed energy of the exposure light and the actual energy. Therefore, the actual energy E of the pulse illuminating light IL is substantially the same as the energy that corresponds to the set exposure amount So. Accordingly, it is possible to carry out accurate exposure on the wafer W.

(2) When the oscillation frequency f is within a predetermined range, scanning exposure on the wafer W is carried out without remeasuring the average pulse energy density H of the pulse illuminating light IL. This makes it possible to quickly execute scanning exposure on the wafer W while securing the necessary energy of the pulse illuminating light IL for this scanning exposure. It is therefore possible to maintain a high throughput while ensuring accurate scanning exposure on the wafer W.

(3) The number of pulses N (exposure pulse number) irradiated per point in each shot area on the wafer W is determined based on the set exposure amount So and the result of measuring the average pulse energy density H of the pulse illuminating light IL. Based on this exposure pulse number N, the oscillation frequency f of the excimer laser light source 16 is determined. Accordingly, the energy of the pulse illuminating light IL corresponding to the sensitivity characteristic of the photoresist is set properly and precise and reliable scanning exposure on the wafer W is accomplished.

(4) Remeasuring the energy density and re-determining the oscillation frequency are repeated until the oscillation frequency f used in the actual pulse emission is substantially the same as the oscillation frequency fn, which has been calculated based on the measurement of the energy density. Therefore, the optimal oscillation frequency at the time of scanning exposure on the wafer W is determined. That is, the energy of the pulse illuminating light IL needed for scanning exposure on the wafer W approximately coincides with the actual energy. This makes it possible to execute more accurate scanning exposure on the wafer W.

(5) When the oscillation frequency f of the excimer laser light source 16 is set equal to or less than the maximum oscillation frequency fmax, scanning exposure is carried out at the maximum scanning speed Vmax. This permits fast scanning exposure on the wafer W and improves the throughput.

(6) The oscillation frequency f of the excimer laser light source 16 is determined based on the set exposure amount So and the result of measuring the average pulse energy density H of the pulse illuminating light IL. Altering the set exposure amount can therefore permit this system to easily cope with photoresists having different sensitivity characteristics.

(7) As the average pulse energy density H of the pulse illuminating light IL is measured before scanning exposure on the wafer W, this embodiment is advantageous because, for example, when an ArF excimer laser light source is used, even if the optical characteristics of the excimer laser light source 16 or the optical system that constitutes the illumination optical system 12 vary (e.g., a change in transmittance with time), the energy is not affected by that change. Even in the case where illumination is switched to modified illumination in which the size and shape of the opening of the illumination-optical-system aperture stop plate 24 are changed in accordance with the types of patterns, such as the cyclic pattern or isolated pattern of the reticle R, the energy is not also affected by that change. Even with those changes made, the energy needed for exposure on the wafer W is easily secured.

Second Embodiment

A second embodiment of the present invention will now be described, centering mainly on what differs from the first embodiment, by referring to FIGS. 5 and 6.

According to the second embodiment, when the oscillation frequency fmax at the time of measuring the energy is higher than the oscillation frequency f that has been determined based on the result of the energy measurement (when the oscillation frequency f is lower than the maximum oscillation frequency fmax), the exposure amount is controlled by finely adjusting the oscillation output of the excimer laser light source 16. The scanning exposure apparatus 10 of the second embodiment uses a control table for fine adjustment of the oscillation output of the excimer laser light source 16.

The control table is prepared prior to scanning exposure on the wafer W. As shown in FIG. 2, part of the laser beam emitted from the laser resonator 16a enters the energy monitor 16c via the beam splitter 16b. The output ES of the energy monitor 16c which corresponds to the incident laser beam is supplied to the main controller 50 via the energy controller 16d. The main controller 50 acquires the correlation between the output ES of the energy controller 16d and the output DS of the integrator sensor 46.

At the time of scanning exposure, the main controller 50 sends the control information TS to the energy controller 16d and the excimer laser light source 16 performs pulse emission. In accordance with this pulse emission, the main controller 50 integrates the output DS of the integrator sensor 46 for each pulse illuminating light IL to acquire the integrated exposure amounts on the individual points on the wafer W in order. The main controller 50 performs adjustment of the transmittance in the rough energy adjuster 20 and the fine adjustment of the energy per pulse in the excimer laser light source 16, prior to exposure on the wafer W, such that the integrated exposure amount substantially coincides with the set exposure amount So.

A description will now be given of an example of the fine adjustment of the energy per pulse in the excimer laser light source 16.

To begin generation of the control table will be discussed. To generate the control table based on the output DS of the integrator sensor 46, it is assumed that the unit of the output ES of the energy monitor 16c (unit of the energy control quantity) is "mJ/pulse". The unit of the output DS of the integrator sensor 46 (unit of the energy control quantity) is "digit/pulse".

It is assumed that the output DS of the integrator sensor 46 has been calibrated with respect to the output of a reference illuminance meter (not shown). The reference illuminance meter is placed at the same height as an image on the Z tilt stage 58 in FIG. 1 (i.e., the surface of the wafer). As the output unit of the reference illuminance meter is "mJ/(cm$^2$·pulse)", the output DS (digit/pulse) of the integrator sensor 46 is calibrated by using a conversion coefficient or conversion function for converting the output DS of the integrator sensor 46 to the exposure amount (mJ/(cm$^2$·pulse)) on the image surface. The use of this conversion coefficient or conversion function allows the exposure amount on the image surface to be indirectly measured from the output DS of the integrator sensor 46.

In the following description, therefore, the exposure amount on the image surface which is indirectly acquired from the output DS of the integrator sensor 46 is referred to as the amount of processing, P (mJ/(cm$^2$·pulse)), done by the integrator sensor 46.

The control table is prepared by acquiring the correlation between the process amount P (mJ/(cm$^2$·pulse)) of the integrator sensor 46 and the output ES (mJ/pulse) of the energy monitor 16c. This is premised on the energy E per pulse of the laser beam LB from the excimer laser light source 16 of FIG. 1 being stabilized at a predetermined center energy Eo. It is also assumed that the transmittance in the rough energy adjuster 20 is set to 100% (open).

The energy E of the laser beam LB varies above or below the center energy Eo in accordance with the following equation (8) where Ndata represents the number of pieces of data used in computing correlation data.

$$E = Eo\{1 \pm (i/Ndata) \times Er/Eo\} \tag{8}$$

where Er is an energy modulation range and Er/Eo is typically 0.02 to 0.03. Further, "i" is an integer whose value varies within a range of 0 to Ndata.

Pulse emission of the excimer laser light source 16 is performed while actually changing the value of i. For each pulse, correlation data (Pi, Ei) between the value Pi of the process amount P of the integrator sensor 46 and the value Ei of the output ES of the energy monitor 16c is recorded.

Figure 5:
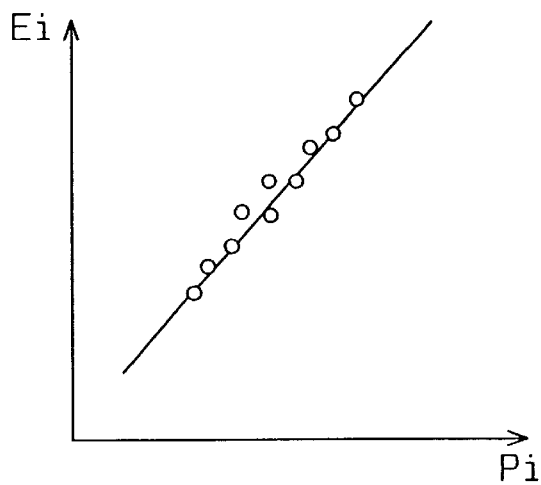
FIG. 5 is a graph showing a correlation between the amount of processing by an integrator sensor and the output of an energy monitor.
Figure 6:
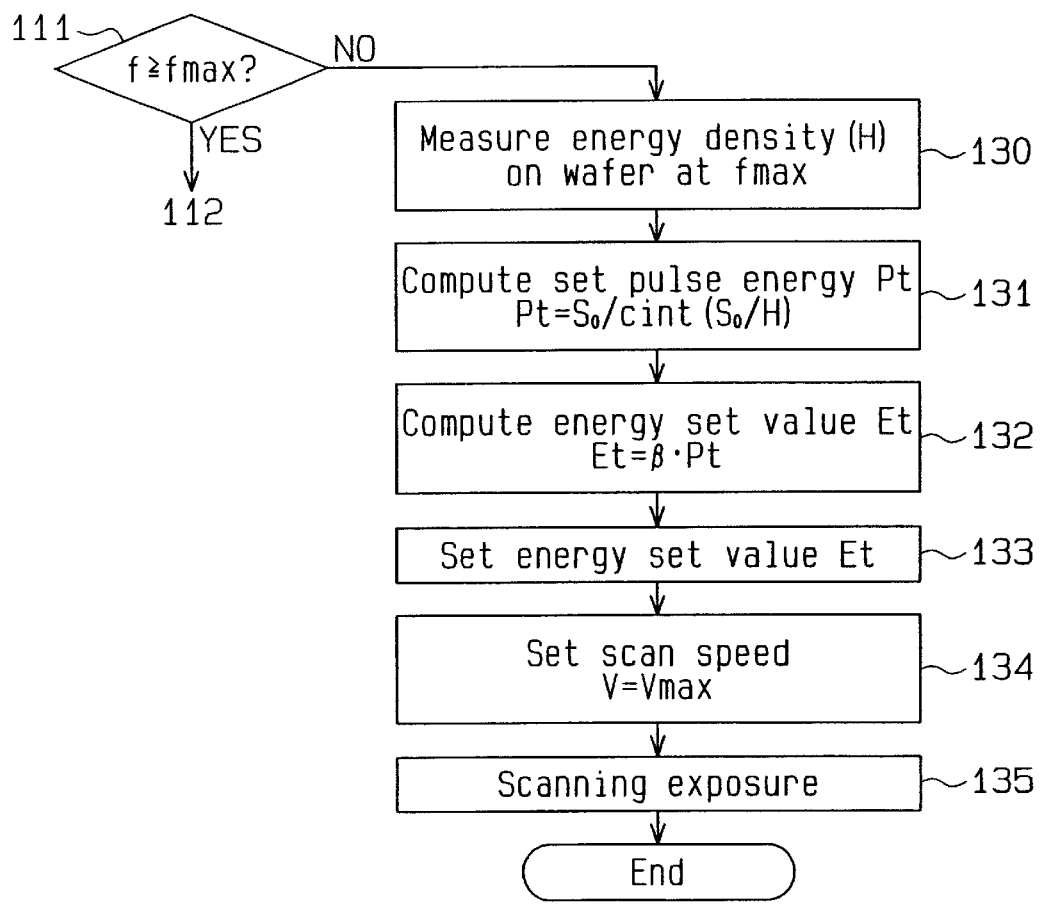
FIG. 6 is a flowchart illustrating only a part of an exposure dose control algorithm for a main controller according to the second embodiment.

FIG. 5 shows the correlation data (Pi, Ei). In FIG. 5, the horizontal scale represents the value Pi of the process amount P of the integrator sensor 46 and the vertical scale represents the output Ei of the energy monitor 16c. To interpolate the correlation data in FIG. 5, a conversion function f(P) or a conversion coefficient for calculating the output ES (mJ/pulse) of the energy monitor 16c from the process amount P (mJ/(cm²·pulse)) of the integrator sensor 46 is acquired. The conversion function f(P) or a conversion coefficient is stored in the memory 51 as the control table shown in FIG. 1. Using the table and the process amount P of the integrator sensor 46, therefore, the main controller 50 can accurately calculate the corresponding output ES of the energy monitor 16c.

It is assumed below that the correlation between the integrator sensor 46 and the energy monitor 16c is approximately linear, its offset is 0 and the slope of the line is a conversion coefficient β. That is, it is assumed that the correlation data (Pi, Ei) is expressed by a linear function as indicated by the solid line in FIG. 5. Therefore, the output ES (mJ/pulse) of the energy monitor 16c is computed from the following equation (9) using the process amount P (mJ/(cm²·pulse)) of the integrator sensor 46 and the conversion coefficient β.

$$ES = \beta \times P \tag{9}$$

The main controller 50 acquires the conversion coefficient β by, for example, least square approximation using the correlation data in FIG. 5, and stores the conversion coefficient β in the memory 51. This completes the preparation of the control table.

The exposure dose control sequence of the second embodiment will now be described. As shown in FIG. 6, when the decision in step 111 is negative, the following processes will be carried out in the second embodiment. The flow proceeds to step 130 to permit the excimer laser light source 16 to perform pulse emission at the maximum oscillation frequency fmax plural times (e.g., several hundred times). Then, the output of the integrator sensor 46 corresponding to that pulse emission is integrated so that the average pulse energy density H (mJ/(cm²·pulse)) on the wafer W at the maximum oscillation frequency fmax is indirectly remeasured.

In the subsequent step 131, set pulse energy Pt (mJ/(cm²·pulse)) with the output of the integrator sensor 46 taken as a reference is calculated from the following equation (10) based on the remeasured average pulse energy density H.

$$Pt = So/cint(So/H) \tag{10}$$

In the next step 132, an energy set value Et (mJ/pulse) of the laser beam LB in the excimer laser light source 16 is calculated from the following equation (11) using the conversion coefficient β stored in the memory 51.

$$Et = \beta \times Pt \tag{11}$$

In the next step 133, the energy set value Et is input to the energy controller 16d. Then, the energy per pulse of the laser beam LB is set to the energy set value Et corresponding to the set exposure amount So. Next, the flow proceeds to step 134 to set the scan speed V to the maximum scanning speed Vmax. The flow then moves to step 135 to execute exposure under the set conditions (Vmax, fmax, Et) after which the entire sequence is terminated.

The second embodiment having the above-described structure has the following advantages.

(1) The energy per pulse of the laser beam LB is finely adjusted based on the set exposure amount So and the result of measuring the average pulse energy density H of the pulse illuminating light IL. Accordingly, the energy of the pulse illuminating light IL which corresponds to the sensitivity characteristic of the photoresist is set properly and accurate and reliable scanning exposure on the wafer W is accomplished.

(2) At the time of measuring the average pulse energy density H of the pulse illuminating light IL, the excimer laser light source 16 emits light at the rated maximum oscillation frequency fmax. This stabilizes the state of the excimer laser light source 16 at the time of measuring the average pulse energy density.

Third Embodiment

A third embodiment of the present invention will now be described, centering mainly on the differences from the first and second embodiments, by referring to FIGS. 7 and 8.

Figure 7:
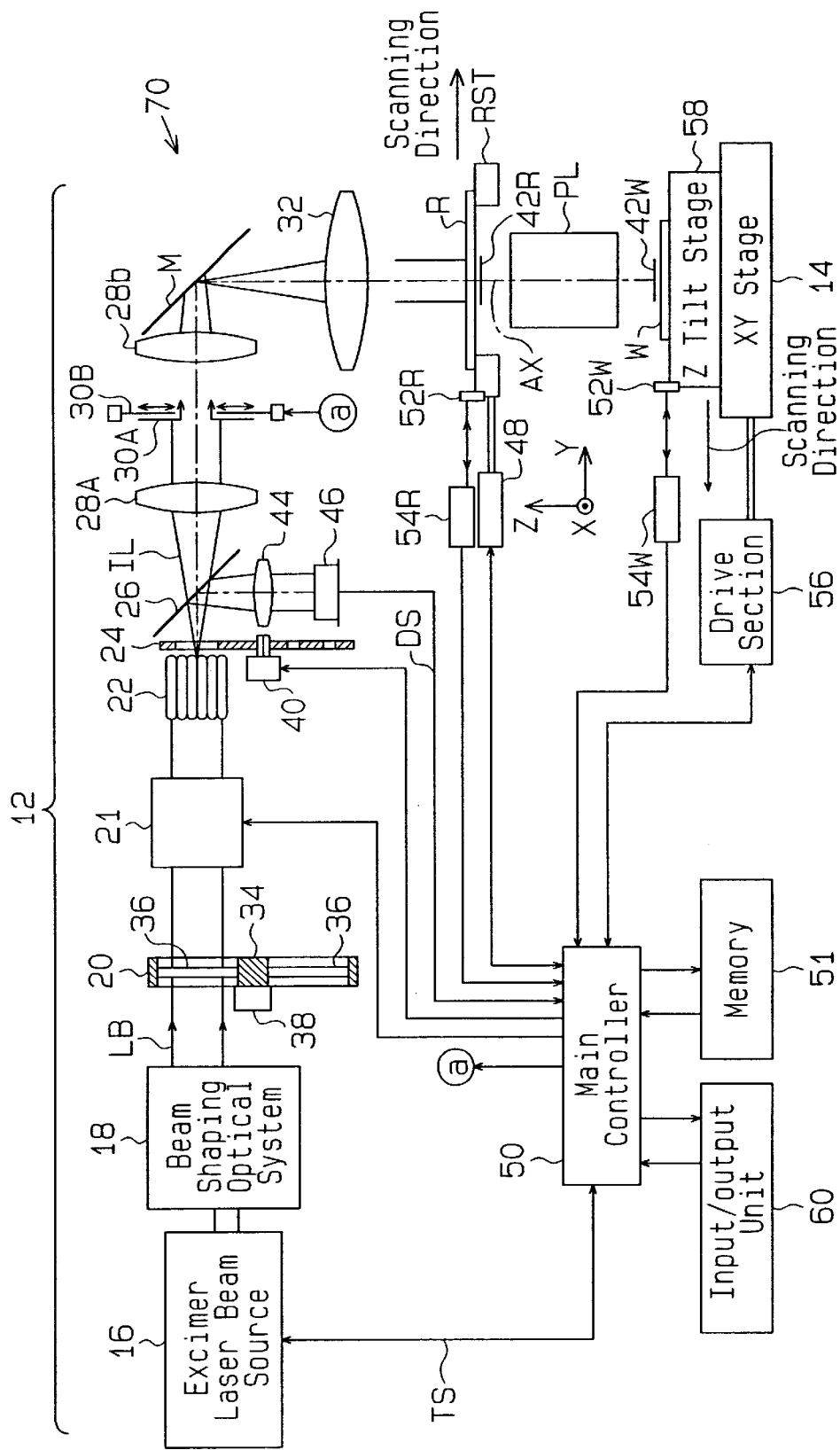
FIG. 7 is a schematic diagram illustrating the structure of a scanning exposure apparatus according to a third embodiment.
Figure 8:
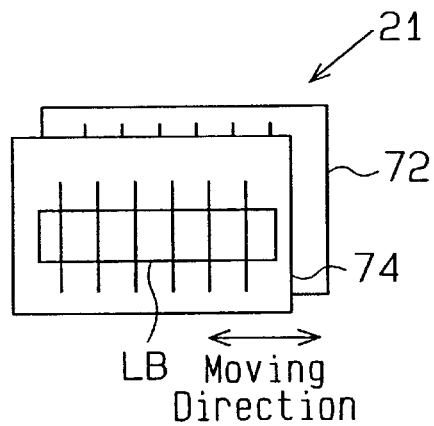
FIGS. 8A and 8B are diagrams exemplifying models of a fine energy adjuster according to the third embodiment.
Figure 8:
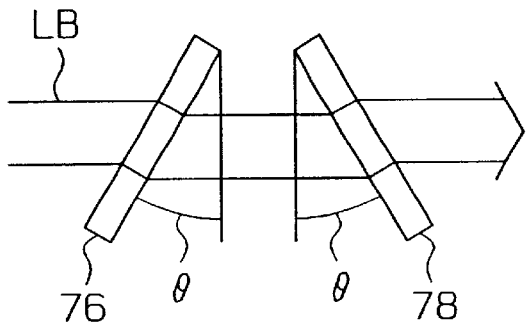

As shown in FIG. 7, a scanning exposure apparatus 70 according to the third embodiment has an attenuation means or a fine energy adjuster 21 located in the optical path of the laser beam LB behind the rough energy adjuster 20. The fine energy adjuster 21 performs fine adjustment of the pulse energy.

The fine energy adjuster 21 preferably includes a double grating type fine adjuster for example as shown in, FIG. 8A. The fine energy adjuster 21 has a fixed grating plate 72 and a movable grating plate 74 placed one over the other in the optical path of the laser beam LB. The fixed grating plate 72 has transmitting portions and light-shielding portions formed at predetermined pitches. The movable grating plate 74 is movable in the pitch direction of the grating. The main controller 50 finely adjusts the transmittance for the laser beam LB by shifting the relative positions of the two grating plates 72 and 74.

Alternatively, the fine energy adjuster 21 may have two optical filter plates as shown in FIG. 8B. Specifically, the fine energy adjuster 21 includes two glass plates 76 and 78 disposed on the optical path of the laser beam LB to be symmetrically tilted at a variable inclination angle θ. A reflection preventing coating is applied on both sides of the glass plates 76 and 77. The transmittances of the glass plates 76 and 77 change in accordance with the incident angle of the laser beam LB. Using this characteristic, the main controller 50 controls the inclination angle θ to finely adjust the overall transmittance for the laser beam LB.

In the scanning exposure apparatus 70 of the third embodiment, with the laser beam LB reduced only by the rough energy adjuster 20 first, the average pulse energy density H at the maximum oscillation frequency fmax is measured. When the oscillation frequency f which is determined based on the measuring result is less than the rate maximum oscillation frequency fmax, the fine energy adjuster 21 further reduces the laser beam LB. Remeasuring the energy is repeated while changing the amount of fine adjustment until the energy E of the pulse illuminating light IL which nearly corresponds to the set exposure amount So is obtained.

This structure has nearly the same advantages as the second embodiment.

Modifications

The individual embodiments may be modified as follows.

In each embodiment, the excimer laser light source 16 as the exposure light source may be replaced with another type of pulsed light source, e.g., a harmonic generator, such as a metal vapor laser or a YAG laser.

In each embodiment, the exposure controller and stage controller may be provided as separate from the main controller 50.

In each embodiment, the integration of the output of the integrator sensor 46 may be carried out by retracting the wafer W by driving the XY stage 14 while the opening formed by both reticle blinds 30A and 30B is fully opened.

Figure 9:
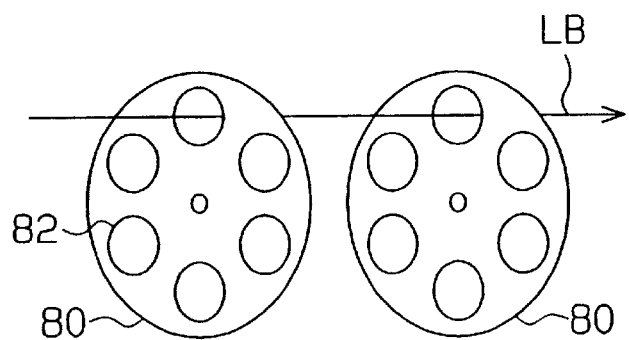
FIG. 9 is a perspective view showing one example of a rough energy adjuster according to a modification.

In each embodiment, as shown in FIG. 9, the rough energy adjuster 20 may have a plurality of rotary plates 80 each having a plurality of ND filters 82 which have different transmittances. In this case, the transmittance with respect to the laser beam LB is changed in plural steps from 100% to any % by moving the individual rotary plates 80 relative to one another.

This structure more finely reduce the laser beam LB.

In each embodiment, a rod integrator may be used in place of the fly eye lens 22 disposed in the illumination optical system 12. In this case, the rod integrator is arranged such that its light-incident surface substantially matches the Fourier transform plane in the illumination optical system 12 and its light-emerging surface is substantially conjugated with the pattern surface of the reticle R in the illumination optical system 12. Therefore, the fixed reticle blind 30A and the movable reticle blind 30B are arranged in the vicinity of the light-emerging surface of the rod integrator, and the aperture stop plate 24 is arranged in the vicinity of the light-incident surface of the rod integrator or is arranged on the Fourier transform plane (pupil plane) set between the rod integrator and the reticle R. Unlike the fly eye lens, the rod integrator, if used, cannot clearly form a light source image, but the secondary light sources in the present invention should include a surface light source from a plurality of virtual images formed by the rod integrator.

Although modified illumination is achieved or the value σ is changed by using the aperture stop plate 24 in the individual embodiments, the structure may be modified such that at least one optical element located, for example, between the excimer laser light source 16 and the optical integrator 22, is movable to change the intensity distribution of the laser beam LB on the light-incident surface of the optical integrator 22. This modification makes it possible to change the intensity distribution of the illuminating light IL on the focus plane of the fly eye lens on the light-emerging side and the Fourier transform plane of the illumination optical system 12 set between the light-emerging surface of the rod integrator and the reticle R. Even if the value σ is decreased or the normal illumination is changed to modified illumination (e.g., annular illumination), the change-originated light loss of the illuminating light IL can be reduced significantly, so that a high throughput can be maintained.

Here, moving at least one optical element (lens) in the direction of the optical axis of the illumination optical system 12 can continuously vary the size of the laser beam LB on the light-incident surface of the optical integrator 22 or the value σ. Further, by adjusting the distance between a pair of conical prisms (axicons) in the direction of the optical axis thereof, which are arranged more on the light source side than on that optical element, it is possible to set the laser beam LB on the light-incident surface of the optical integrator 22 in an annular shape whose intensity distribution becomes higher on the outer side than the center portion. That is, annular illumination becomes available. By performing both adjusting of the distance between the axicons and the movement of the optical element, it is possible to alter the outside diameter, the inside diameter and the annular ratio (the ratio of the outside diameter to the inside diameter) of the illuminating light IL whose intensity distribution becomes annular on the Fourier transform plane of the illumination optical system 12.

In the case of realizing modified illumination subject to enhance the intensity distribution of the illuminating light IL in four local areas eccentric to the optical axis on the Fourier transform plane of the illumination optical system 12, the distance between the axicons is adjusted to make the intensity distribution have an annular shape and transform the aperture stops having light-shielding sections or light-reducing sections which define the four local areas to the Fourier transform plane. At this time, one aperture stop selected from a plurality of aperture stops whose light-shielding sections (or light-reducing sections) have different shapes or sizes is arranged on the Fourier transform plane parallel to at least one of the adjustment of the distance between the axicons and the movement of the optical element. This allows even modified illumination to change the intensity distribution of the illuminating light IL.

In the first embodiment, the exposure amount on each point in each shot area on the wafer W may be adjusted by adjusting the slit width Ws by altering the rectangular opening formed by the fixed reticle blind 30A and the movable reticle blind 30B. This structure improves the degree of freedom in setting the exposure conditions for the wafer W.

In the exposure dose control sequence according to the first embodiment, when the decision in step 104 becomes affirmative without changing the setting of the transmittance of the ND filter 36 of the rough energy adjuster 20, the flow may jump to step 110, skipping steps 106 to 109. This structure shortens the processing time in the exposure dose control sequence and improves the throughput.

In the second embodiment, the average value of the numbers of pulses that have been measured simultaneously may be recorded as single data of the correlation data (Pi, Ei) at the time of acquiring the correlation between the process amount P of the integrator sensor 46 and the output ES of the energy monitor 16c in the excimer laser light source 16. This structure improves the precision of the correlation.

In the third embodiment, an acousto-optic modulator which uses a Raman-Nath diffraction (Debye-Sears effect) disclosed in, for example, Japanese Unexamined Patent Publication No. 6-302491 and its corresponding U.S. Pat. No. 5,574,537, may be used as the fine energy adjuster 21. In this case, the amount of light transmittance is continuously changed by controlling the modulation state of the acousto-optic modulator.

In each embodiment, the oscillation frequency of the excimer laser light source 16 at the time of measuring the energy need not be the rated maximum oscillation frequency fmax but may have an arbitrary value. When the oscillation frequency that provides the most stable energy state for the excimer laser light source 16 differs from the maximum oscillation frequency fmax, for instance, the oscillation frequency that provides the most stable energy state is selected. It is to be noted however that the oscillation frequency is set such that the oscillation frequency of the excimer laser light source 16 at the time of scanning exposure (the oscillation frequency calculated from the equation (7)) approximately coincides with the oscillation frequency of the excimer laser light source 16 at the time of measuring the energy. In consideration of the throughput, therefore, it is preferable that the oscillation frequency at the time of measuring the energy be the rated maximum oscillation frequency fmax.

In each embodiment, the scan speed V for the wafer W and the oscillation frequency of the excimer laser light source 16 may be set to values different from the respective maximum values. The scanning exposure conditions including the scan speed V, the oscillation frequency f and the width Ws of the pulse illuminating light IL are determined such that the oscillation frequency of the excimer laser light source 16 at the time of measuring the energy nearly matches the oscillation frequency at the time of scanning exposure. In consideration of the throughput, therefore, it is preferable that at least one of the scan speed V and the oscillation frequency f should take a maximum value. If both parameters do not take maximum values, it is desirable that they are as close to the maximum values as possible.

The exposure apparatus according to the present invention is not limited to the type which is used for fabricating semiconductor devices. Nor is it limited to a scanning exposure apparatus of the step and scan type or a reduction exposure type exposure apparatus. This exposure apparatus includes a full wafer exposure apparatus (stepper) of the step and repeat type, an equal magnification (or enlargement) projection type exposure apparatus (mirror projection aligner), and exposure apparatus which is used in manufacturing a liquid crystal display device, an image pickup device, a thin-film magnetic head and a reticle or mask.

An exposure apparatus which uses deep ultraviolet rays (DUV) or vacuum ultraviolet rays (VUV) usually uses a transmission reticle, and uses quartz glass, fluorine-doped quartz glass, fluorite, magnesium fluoride, crystal or the like as the reticle substrate. An Extreme Ultra Violet (EUV) exposure apparatus uses a reflection type mask, while the proximity X-ray exposure apparatus, the electron beam exposure apparatus or the like use a transmission mask (stencil mask or membrane mask) and a silicon wafer or the like as the mask substrate.

The projection optical system PL is not limited to a refraction system which is comprised only of a plurality of refractive optical elements, but may be a reflection/refraction system which has both a refractive optical element and a reflection optical element (concave mirror or the like), or a reflection system which is comprised only of a plurality of reflection optical elements. Available as the projection optical system of the reflection/refraction type is an optical system which has at least a beam splitter and a concave mirror as the reflection/refraction elements, an optical system which does not use a beam splitter but has a concave mirror and a mirror as the reflection optical elements, and an optical system which has a plurality of refraction elements and two reflection optical elements (at least one of which is a concave mirror) arranged on the same optical axis, as disclosed in U.S. Pat. Nos. 5,031,976, 5,788,229 and 5,717,518. The present invention can be adapted to, for example, a proximity type exposure apparatus which does not use a projection optical system.

The present invention may be adapted to the EUV exposure apparatus which uses EUV rays as exposure illumination light that are emitted in the form of pulses from an SOR or a laser plasma light source. The EUV rays has the spectrum of 5 to 15 nm (soft X-ray region). In this exposure apparatus, the illumination areas on the reflection mask are defined to be arc slits. Further, as the reflection mask and wafer are moved synchronously at the speed ratio according to the magnification of the reduction projection optical system which includes a plurality of reflection optical elements (mirrors), the pattern of the reflection mask is transferred to the wafer.

The present invention may be adapted to an exposure apparatus that uses, as the exposure illumination light, harmonic waves obtained by amplifying the single-wavelength laser beam of the infrared range or visible range, emitted from a DFB semiconductor laser or a fiber laser, using an erbium-doped (or erbium-yttrium-doped) fiber amplifier and converting the laser beam to the ultraviolet rays using a non-linear optical crystal.

Specifically, with the oscillation wavelength of a single-wavelength laser beam in a range of 1.51 to 1.59 $\mu$m, 8× harmonic waves whose wavelength lies in a range of 189 to 199 nm or 10× harmonic waves whose wavelength lies in a range of 151 to 159 nm are output. When the oscillation wavelength is set within a range of 1.544 to 1.553 $\mu$m, particularly, 8× harmonic waves whose wavelength lies in a range of 193 to 194 nm, i.e., ultraviolet rays having about the same wavelength as that of the ArF excimer laser, are acquired. When the oscillation wavelength is set within a range of 1.57 to 1.58 $\mu$m, 10× harmonic waves whose wavelength lies in a range of 157 to 158 nm, i.e., ultraviolet rays having about the same wavelength as that of the $F_2$ laser, are acquired.

When the oscillation wavelength is set within a range of 1.03 to 1.12 $\mu$m, 7× harmonic waves whose wavelength lies in a range of 147 to 160 nm are output. When the oscillation wavelength is set within a range of 1.099 to 1.106 $\mu$m, particularly, 7× harmonic waves whose wavelength lies in a range of 157 to 158 $\mu$m, i.e., ultraviolet rays having about the same wavelength as that of the $F_2$ laser, are acquired. As a single-wavelength oscillation laser, an yttrium-doped fiber laser or the like is used.

The exposure apparatus according to each of the above-described embodiments can be manufactured by assembling the illumination optical system comprised of a plurality of optical elements and the projection optical system into the body of the exposure apparatus and adjusting the optical characteristics, attaching the reticle stage or wafer stage comprising multiple mechanical parts to the body of the exposure apparatus and connecting the wires and pipes to the exposure apparatus, and further performing the general adjustment (electric adjustment, operational check or the like). It is desirable that exposure should be carried out in a clean room where the temperature and humidity of the exposure apparatus, the degree of cleanness and the like are controlled.

A semiconductor device is fabricated through a step of designing the functions of the device, a step of producing a reticle based on this design step, a step of forming a wafer of a silicon material, a step of exposing the pattern of the reticle on the wafer by the exposure apparatus of any of the above-described embodiments, a step of building up the device (including a dicing step, bonding step and packaging step), an inspection step and so forth.

The irradiation control apparatus and irradiation control method for the excimer laser light source 16 according to the present invention may be adapted to a pulsed light source for a laser beam machine or the like.

The above-described embodiments can cover the following technical concepts.

(1) The irradiation control method for a pulsed light source, wherein the adjustment of the energy per pulsed beam attenuates the pulsed beam from the pulsed light source by guiding the pulsed beam to the light reducing means.

(2) The irradiation control method for a pulsed light source, wherein the adjustment of the energy per pulsed beam adjusts the oscillation output of the pulsed light source.

The present examples and embodiments are to be considered as illustrative and not restrictive, and the invention is not to be limited to the details given herein, but may be modified within the scope and equivalence of the appended claims.

What is claimed is:

1. An irradiation control method for a pulsed light source which irradiates a pulsed beam on an illumination subject, comprising the steps of:

measuring energy of a pulsed beam having a predetermined oscillation frequency emitted from the pulsed light source;

determining an actual oscillation frequency of the pulsed light source in accordance with the number of pulses of the pulsed beam which is determined based on a relationship between the measured energy and a predetermined illumination energy;

comparing the determined oscillation frequency and the predetermined oscillation frequency; and adjusting the energy of the pulsed beam when a comparison result shows that the determined oscillation frequency differs from the predetermined oscillation frequency.

2. The irradiation control method according to claim 1, wherein the oscillation frequency determining step includes determining the actual oscillation frequency while maintaining at least one of a moving speed of the illumination subject and the predetermined oscillation frequency at a maximum value when the pulsed beam is being irradiated and the illumination subject is being moved.

3. The irradiation control method according to claim 1, wherein the energy adjusting step includes controlling the pulsed light source to emit the pulsed beam having the determined oscillation frequency.

4. The irradiation control method according to claim 1, wherein the energy adjusting step includes reducing illuminating energy per pulsed beam.

5. An irradiation control apparatus which controls a pulsed light source that irradiates a pulsed beam on an illumination subject, comprising:

a measuring device which measures energy of a pulsed beam having a predetermined oscillation frequency emitted from the pulsed light source;

a determining device which is electrically connected to the measuring device and determines an oscillation frequency of the pulsed light source in accordance with the number of pulses of the pulsed beam which is determined based on a relationship between the measured energy and predetermined illumination energy;

a comparator which is electrically connected to the determining device and compares the determined oscillation frequency and the predetermined oscillation frequency; and an adjusting device which is electrically connected to the comparator and adjusts the energy of the pulsed beam when a comparison result of the comparator shows that the determined oscillation frequency differs from the predetermined oscillation frequency.

6. The irradiation control apparatus according to claim 5, wherein the determining device determines the oscillation frequency while maintaining at least one of a moving speed of the illumination subject and the predetermined oscillation frequency at a maximum value when the pulsed beam is being irradiated and the illumination subject is being moved.

7. The irradiation control apparatus according to claim 5, wherein the adjusting device controls the pulsed light source to emit a pulsed beam having the determined oscillation frequency.

8. The irradiation control apparatus according to claim 5, wherein the adjusting device reduces illuminating energy per pulsed beam.

9. An exposure apparatus which irradiates a pulsed beam from a pulsed light source on a photosensitive substrate via a mask to expose a pattern of the mask on the photosensitive substrate, the exposure apparatus comprising:

a controller that controls the pulsed light source which irradiates the pulsed beam on the substrate, the controller including, a measuring device which measures energy of a pulsed beam having a predetermined oscillation frequency emitted from the pulsed light source, a determining device which is electrically connected to the measuring device and determines an actual oscillation frequency of the pulsed light source in accordance with the number of pulses of the pulsed beam which is determined based on a relationship between the measured energy and a predetermined illumination energy, a comparator which is electrically connected to the determining device and compares the determined oscillation frequency and the predetermined oscillation frequency; and an adjusting device which is electrically connected to the comparator and adjusts the energy of the pulsed beam when a comparison result of the comparator shows that the determined oscillation frequency differs from the predetermined oscillation frequency.

10. The exposure apparatus according to claim 9, wherein the determining device determines the oscillation frequency while maintaining at least one of a moving speed of the substrate and the predetermined oscillation frequency at a maximum value when the pulsed beam is being irradiated and the substrate is being moved.

11. The exposure apparatus according to claim 9, wherein the adjusting device controls the pulsed light source to emit a pulsed beam having the determined oscillation frequency.

12. The exposure apparatus according to claim 9, wherein the adjusting device includes a reducing device which reduces illuminating energy per pulsed beam.

13. The exposure apparatus according to claim 9, wherein the mask and the photosensitive substrate are movable and the exposure apparatus further comprises a scanning exposure mechanism which moves the mask and the photosensitive substrate in synchronism with each other.

14. An exposure method for irradiating a pulsed beam emitted from a light source on a photosensitive substrate via a mask to expose a pattern of the mask on the photosensitive substrate, comprising the steps of:

measuring energy of a pulsed beam having a predetermined oscillation frequency emitted from the light source;

determining an actual oscillation frequency of the pulsed beam at a time of exposing the photosensitive substrate based on the measured energy;

comparing the determined oscillation frequency and the predetermined oscillation frequency; and adjusting the energy of the pulsed beam emitted from the light source when a comparison result shows that the predetermined oscillation frequency at a time of measuring the energy differs from the actual oscillation frequency determined at the time of exposure.

15. The exposure method according to claim 14, wherein the energy adjusting step includes remeasuring the energy of the pulsed beam emitted from the light source using the determined actual oscillation frequency.

16. The exposure method according to claim 15, further comprising the step of performing scanning exposure on the photosensitive substrate with the pulsed beam via the mask while moving the mask and the photosensitive substrate relative to each other.

17. The exposure method according to claim 16, wherein the photosensitive substrate has a plurality of areas defined thereon;
the scanning exposure step includes sequentially transferring the mask pattern onto the plurality of defined areas on the photosensitive substrate in accordance with a step and scan system; and
the energy remeasuring step is carried out prior to the scanning exposure step.

18. The exposure method according to claim 17, wherein the energy adjusting step includes the steps of:
determining the number of pulsed beams to be irradiated on individual points in the defined areas on the photosensitive substrate based on the measured energy and a sensitivity characteristic of the photosensitive substrate; and
determining scanning exposure conditions for the photosensitive substrate including an oscillation frequency of the light source based on the determined number of pulsed beams.

19. The exposure method according to claim 18, wherein the scanning exposure conditions include the oscillation frequency of the light source, a moving speed of the photosensitive substrate and a width of the pulsed beam relating to a moving direction of the photosensitive substrate.

20. The exposure method according to claim 16, wherein the remeasuring the energy step is not performed when the determined oscillation frequency is within a predetermined range, and in the scanning exposure step, the pulsed beam having the determined oscillation frequency is emitted from the light source.

21. An exposure method for irradiating a pulsed beam emitted from a light source on a photosensitive substrate via a mask to expose a pattern of the mask on the photosensitive substrate, comprising the steps of:
measuring energy of a pulsed beam having a predetermined oscillation frequency emitted from the light source;
determining an actual oscillation frequency of the pulsed beam at a time of exposing the photosensitive substrate based on the measured energy;
comparing the determined oscillation frequency and the predetermined oscillation frequency; and
remeasuring the energy of the pulsed beam emitted from the light source based on the determined oscillation frequency when a comparison result shows that the predetermined oscillation frequency at a time of measuring the energy differs from the determined oscillation frequency at the time of exposure.

22. The exposure method according to claim 21, further comprising the step of performing scanning exposure on the photosensitive substrate with the pulsed beam via the mask while moving the mask and the photosensitive substrate relative to each other.

23. The exposure method according to claim 22, wherein the photosensitive substrate has a plurality of areas defined thereon;
the scanning exposure step includes sequentially transferring the mask pattern onto the plurality of defined areas on the photosensitive substrate in accordance with a step and scan system; and
the energy remeasuring step is carried out prior to the scanning exposure step.

24. The exposure method according to claim 22, wherein the remeasuring the energy step is not performed when the determined oscillation frequency is within a predetermined range, and in the scanning exposure step, the pulsed beam having the determined oscillation frequency is emitted from the light source.

25. The exposure method according to claim 23, wherein the energy adjusting step includes the steps of:
determining the number of pulsed beams to be irradiated on individual points in the defined areas on the photosensitive substrate based on the measured energy and a sensitivity characteristic of the photosensitive substrate; and
determining scanning exposure conditions for the photosensitive substrate including an oscillation frequency of the light source based on the determined number of pulsed beams.

26. The exposure method according to claim 25, wherein the scanning exposure conditions include the oscillation frequency of the light source, a moving speed of the photosensitive substrate and a width of the pulsed beam relating to a moving direction of the photosensitive substrate.

27. The exposure method according to claim 21, wherein the energy remeasuring step includes the step of redetermining the oscillation frequency of the light source based on the remeasured energy when the determined oscillation frequency is lower than the predetermined oscillation frequency at a time of measuring the energy.

28. The exposure method according to claim 27, wherein the energy remeasuring step includes repeating the energy remeasuring step and the oscillation-frequency redetermining step until the determined oscillation frequency is within a predetermined range.

29. The exposure method according to claim 22, wherein the oscillation frequency of the light source is determined to approximately maximize the moving speed of the photosensitive substrate in the scanning exposure.

30. The exposure method according to claim 21, wherein the predetermined oscillation frequency at a time of measuring the energy is a rated maximum frequency.

31. The exposure method according to claim 21, wherein the oscillation frequency determining step includes determining the actual oscillation frequency in accordance with a change in at least one of a sensitivity characteristic of the photosensitive substrate and the energy of the pulsed beam irradiated on the photosensitive substrate.

32. The exposure method according to claim 31, wherein the energy of the pulsed beam changes as a result of a time-dependent change in at least one of a transmittance of an illumination optical system which irradiates the pulsed beam emitted from the light source onto the mask, a transmittance of a projection optical system which projects a pulsed beam emerging from the mask onto the photosensitive substrate and an oscillation output of the light source.

33. The exposure method according to claim 21, wherein when at least one of a shape and size of a secondary light source, which is formed by an illumination optical system which irradiates the pulsed beam from the light source onto the mask, is changed in accordance with the mask pattern, the oscillation frequency determining step includes determining the actual oscillation frequency of the light source in accordance with the change.

34. The exposure method according to claim 21, wherein the predetermined oscillation frequency at a time of measuring the energy is a rated maximum frequency.

35. The exposure method according to claim 21, wherein the actual oscillation frequency determining step includes determining the actual oscillation frequency in accordance with a change in at least one of a sensitivity characteristic of the photosensitive substrate and the energy of the pulsed beam irradiated on the photosensitive substrate.

36. The exposure method according to claim 35, wherein the energy of the pulsed beam changes as a result of a time-dependent change in at least one of a transmittance of an illumination optical system which irradiates the pulsed beam emitted from the light source onto the mask, a transmittance of a projection optical system which projects a pulsed beam emerging from the mask onto the photosensitive substrate and an oscillation output of the light source.

37. The exposure method according to claim 21, wherein when at least one of a shape and size of a secondary light source, which is formed by an illumination optical system which irradiates the pulsed beam from the light source onto the mask, is changed in accordance with the mask pattern, the oscillation frequency determining step includes determining the actual oscillation frequency of the light source in accordance with the change.

38. A method of manufacturing an irradiation control apparatus that controls a pulsed light source which irradiates a pulsed beam on an illumination subject, comprising the steps of:
providing a measuring device which measures energy of a pulsed beam having a predetermined oscillation frequency emitted from the pulsed light source;
providing a determining device which is electrically connected to the measuring device and determines an actual oscillation frequency of the pulsed light source in accordance with the number of pulses of the pulsed beam which is determined based on a relationship between the measured energy and a predetermined illumination energy;
providing a comparator which is electrically connected to the determining device and compares the determined oscillation frequency and the predetermined oscillation frequency; and
providing an adjusting device which is electrically connected to the comparator and adjusts the energy of the pulsed beam when a comparison result of the comparator shows that the determined actual oscillation frequency differs from the predetermined oscillation frequency.

39. A method of manufacturing an exposure apparatus which irradiates a pulsed beam from a pulsed light source on a photosensitive substrate via a mask to expose a pattern of the mask on the photosensitive substrate, the method comprising the steps of:
providing an apparatus that controls the pulsed light source which irradiates the pulsed beam on the substrate, the apparatus including a measuring device which measures energy of a pulsed beam having a predetermined oscillation frequency emitted from the pulsed light source, a determining device which is electrically connected to the measuring device and determines an actual oscillation frequency of the pulsed light source in accordance with the number of pulses of the pulsed beam which is determined based on a relationship between the measured energy and predetermined illumination energy, a comparator which is electrically connected to the determining device and compares the determined oscillation frequency and the predetermined oscillation frequency, and an adjusting device which is electrically connected to the comparator and adjusts the energy of the pulsed beam when a comparison result of the comparator shows that the determined oscillation frequency differs from the predetermined oscillation frequency; and
providing a scanning exposure mechanism which moves the mask and the photosensitive substrate in synchronism with each other.

40. A device manufacturing method comprising the steps of:
exposing a pattern of a mask on a photosensitive substrate substrate using the exposure method including the steps of:
measuring energy of a pulsed beam having a predetermined oscillation frequency emitted from the light source,
determining an actual oscillation frequency of the pulsed beam at a time of exposing the photosensitive substrate based on the measured energy,
comparing the determined oscillation frequency and the predetermined oscillation frequency, and
adjusting the energy of the pulsed beam emitted from the light source when a comparison result shows that the predetermined oscillation frequency at a time of measuring the energy differs from the actual oscillation frequency determined at the time of exposure; and
fabricating a device using the photosensitive substrate.

41. A device manufacturing method comprising the steps of:
exposing a pattern of a mask on a photosensitive substrate using the exposure method including the steps of;
measuring energy of a pulsed beam having a predetermined oscillation frequency emitted from the light source,
determining an actual oscillation frequency of the pulsed beam at a time of exposing the photosensitive substrate based on the measured energy,
comparing the determined oscillation frequency and the predetermined oscillation frequency, and
remeasuring the energy of the pulsed beam emitted from the light source based on the determined oscillation frequency when a comparison result shows that the predetermined oscillation frequency at a time of measuring the energy differs from the determined oscillation frequency at the time of exposure; and
fabricating a device using the photosensitive substrate.

42. A device manufactured by exposing a pattern of a mask onto a photosensitive substrate by irradiating an energy-adjusted pulsed beam by using the exposure apparatus including:
a controller that controls the pulsed light source which irradiates the pulsed beam on the substrate, the controller including,
a measuring device which measures energy of a pulsed beam having a predetermined oscillation frequency emitted from the pulsed light source,
a determining device which is electrically connected to the measuring device and determines an actual oscillation frequency of the pulsed light source in accordance with the number of pulses of the pulsed beam which is determined based on a relationship between the measured energy and a predetermined illumination energy, a comparator which is electrically connected to the determining device and compares the determined oscillation frequency and the predetermined oscillation frequency, and an adjusting device which is electrically connected to the comparator and adjusts the energy of the pulsed beam when a comparison result of the comparator shows that the determined oscillation frequency differs from the predetermined oscillation frequency.

43. An exposure apparatus which irradiates a pulsed beam emitted from a light source on a photosensitive substrate via a mask to expose a pattern of the mask on the photosensitive substrate, comprising:

a measuring device that measures energy of a pulsed beam having a predetermined oscillation frequency emitted from the light source;

a determining device, electrically connected to the measuring device, that determines an actual oscillation frequency of the pulsed beam at a time of exposing the photosensitive substrate based on the measured energy;

a comparator which is electrically connected to the determining device and compares the determined oscillation frequency and the predetermined oscillation frequency; and a remeasuring device, electrically connected to the comparator, that remeasures the energy of the pulsed beam emitted from the light source based on the determined oscillation frequency when a comparison result of the comparator shows that the predetermined oscillation frequency at a time of measuring the energy differs from the determined oscillation frequency at the time of exposure.

* * * * *